United States Patent
Taylor et al.

(10) Patent No.: US 11,682,848 B2
(45) Date of Patent: *Jun. 20, 2023

(54) RADIO FREQUENCY CIRCUIT BOARD INTERCONNECT ASSEMBLY

(71) Applicant: Raytheon Company, Waltham, MA (US)

(72) Inventors: Brian L. Taylor, Anna, TX (US); David M. Dyer, Prosper, TX (US); Steven Sprinkle, Van Alstyne, TX (US); Paul E. Schlittler, Mc Kinney, TX (US)

(73) Assignee: Raytheon Company, Waltham, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/523,406

(22) Filed: Nov. 10, 2021

(65) Prior Publication Data

US 2022/0255241 A1    Aug. 11, 2022

Related U.S. Application Data

(62) Division of application No. 16/897,149, filed on Jun. 9, 2020, now Pat. No. 11,196,182.

(51) Int. Cl.
*H01Q 23/00* (2006.01)
*H01Q 9/16* (2006.01)
*H01Q 21/28* (2006.01)

(52) U.S. Cl.
CPC .............. *H01Q 23/00* (2013.01); *H01Q 9/16* (2013.01); *H01Q 21/28* (2013.01)

(58) Field of Classification Search
CPC ........... H01Q 21/28; H01Q 9/16; H01Q 23/00
See application file for complete search history.

(56) References Cited

U.S. PATENT DOCUMENTS

| 6,533,610 B1 | 3/2003 | Dai et al. |
|---|---|---|
| 2020/0235488 A1 | 7/2020 | Lin et al. |

FOREIGN PATENT DOCUMENTS

| CN | 101982903 A | 3/2011 |
|---|---|---|
| CN | 105098542 B | 11/2017 |
| EP | 0793299 A1 | 9/1997 |
| JP | 2006-156118 A | 6/2006 |
| JP | 2014-049721 A | 3/2014 |
| WO | WO 2011/076138 A1 | 6/2011 |

OTHER PUBLICATIONS

International Search Report for International Application No. PCT/US21/36648 dated Sep. 17, 2021, 14 pages.

*Primary Examiner* — Graham P Smith (57) ABSTRACT

A radio frequency (RF) circuit connection assembly comprises a RF circuit board and a RF connector. The RF circuit board has a first side and a second side opposite the first side. A RF circuit is located on the first side and an aperture extends through the RF circuit board from the first side to the second side. The RF connector comprises a barrel having a socket configured to receive a RF bullet, a flange having a mounting surface, and a RF connector pin extending laterally from the barrel. The barrel of the RF connector extends through the aperture of the RF circuit board such that the mounting surface of the flange is seated against the first side of the RF circuit board, and the RF connector pin is electrically coupled to the RF circuit on the first side of the RF circuit board.

23 Claims, 8 Drawing Sheets

SECTION A-A

SECTION A-A
FIG. 5

RADIO FREQUENCY CIRCUIT BOARD INTERCONNECT ASSEMBLY

RELATED APPLICATION

This is a divisional application of U.S. application Ser. No. 16/897,149, filed Jun. 9, 2020, entitled "Radio Frequency Circuit Board Interconnect Assembly", which is incorporated by reference in its entirety herein.

GOVERNMENT LICENSE RIGHTS

This invention was made with government support under contract HQ0727-16-D-0006-HQ072718F1632 awarded by the United States Department of Defense. The government has certain rights in the invention.

BACKGROUND

Figure 1:
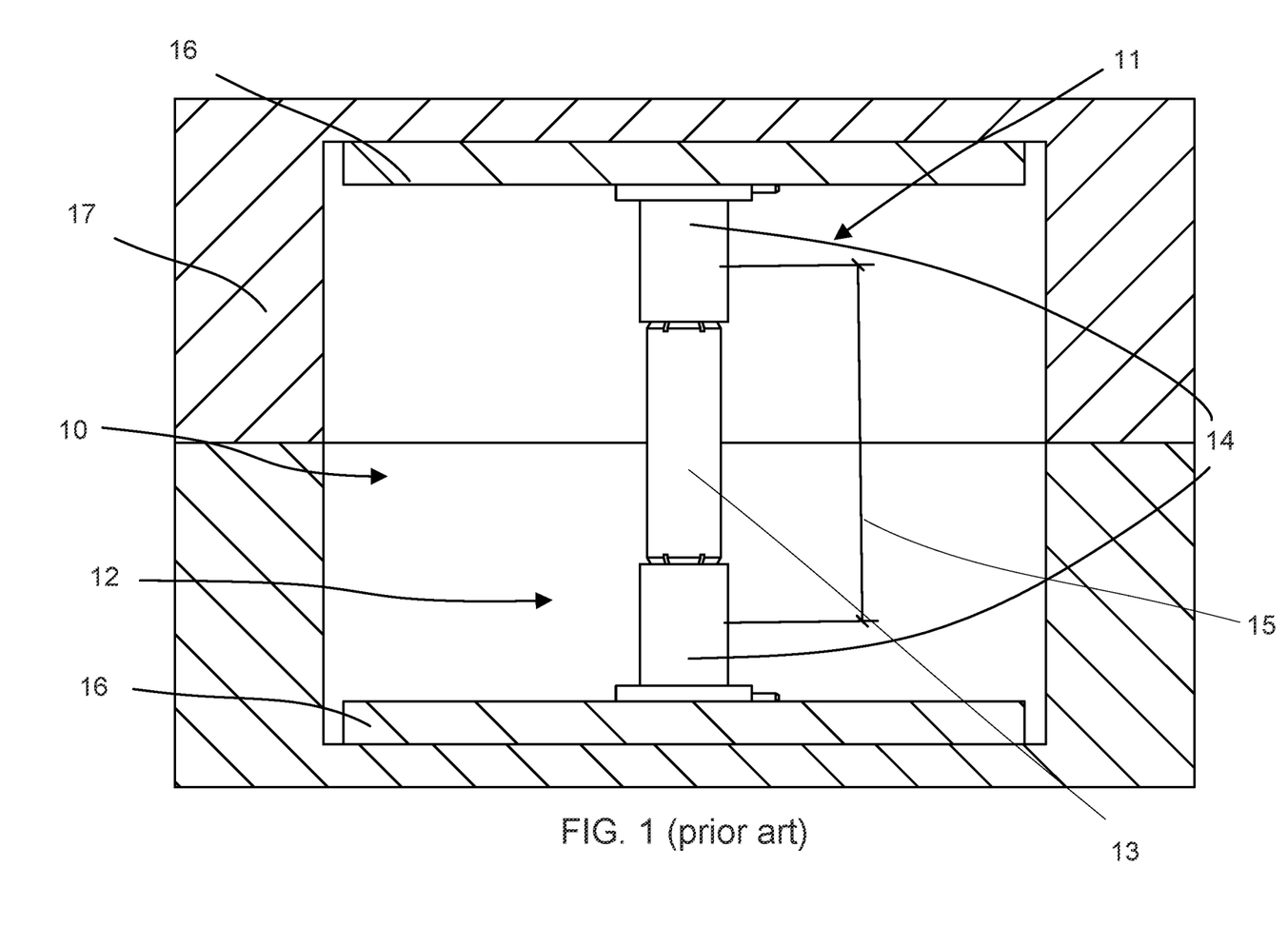
FIG. 1 illustrates an example prior art stacked RF circuit board assembly showing first and second RF connection assemblies in connection with a RF bullet.

Stacked radio frequency (RF) circuit board assemblies can contain stacked RF circuit boards interconnected by a RF bullet spanning the distance between each stacked RF circuit board. FIG. 1 illustrates an example of an existing stacked RF circuit board assembly 10 comprising a first RF circuit connection assembly 11, a second RF circuit connection assembly 12, and a RF bullet 13 communicatively coupling the first RF circuit connection assembly 11 to the second RF circuit connection assembly 12. Each RF circuit connection assembly 11, 12 can comprise a RF circuit board 16 mounted to a structure 17, and a RF connector 14 mounted to the RF circuit board 16 and configured to receive an end of the RF bullet 13. The interface between the base of each RF connector 14 and the RF circuit board 16 defines a reference plane (i.e., where the plug and jack meet) that determines the length of the RF bullet for connecting the two RF circuit connection assemblies 11, 12. If the RF bullet 13 is longer than a distance 15 between the bottom of the sockets of the RF connectors 14, then there is a risk that a RF connector 14 or the RF bullet 13 will be damaged during installation from contact between the bottom of a socket of the RF connector 14 and the RF bullet 13. Conversely, if the RF bullet 13 is shorter than the distance 15 between the sockets of the RF connectors 14, the performance of the connection can be compromised, ultimately manifesting itself as poor performance that is measured in VSWR (Voltage Standing Wave Ratio).

Figure 2:
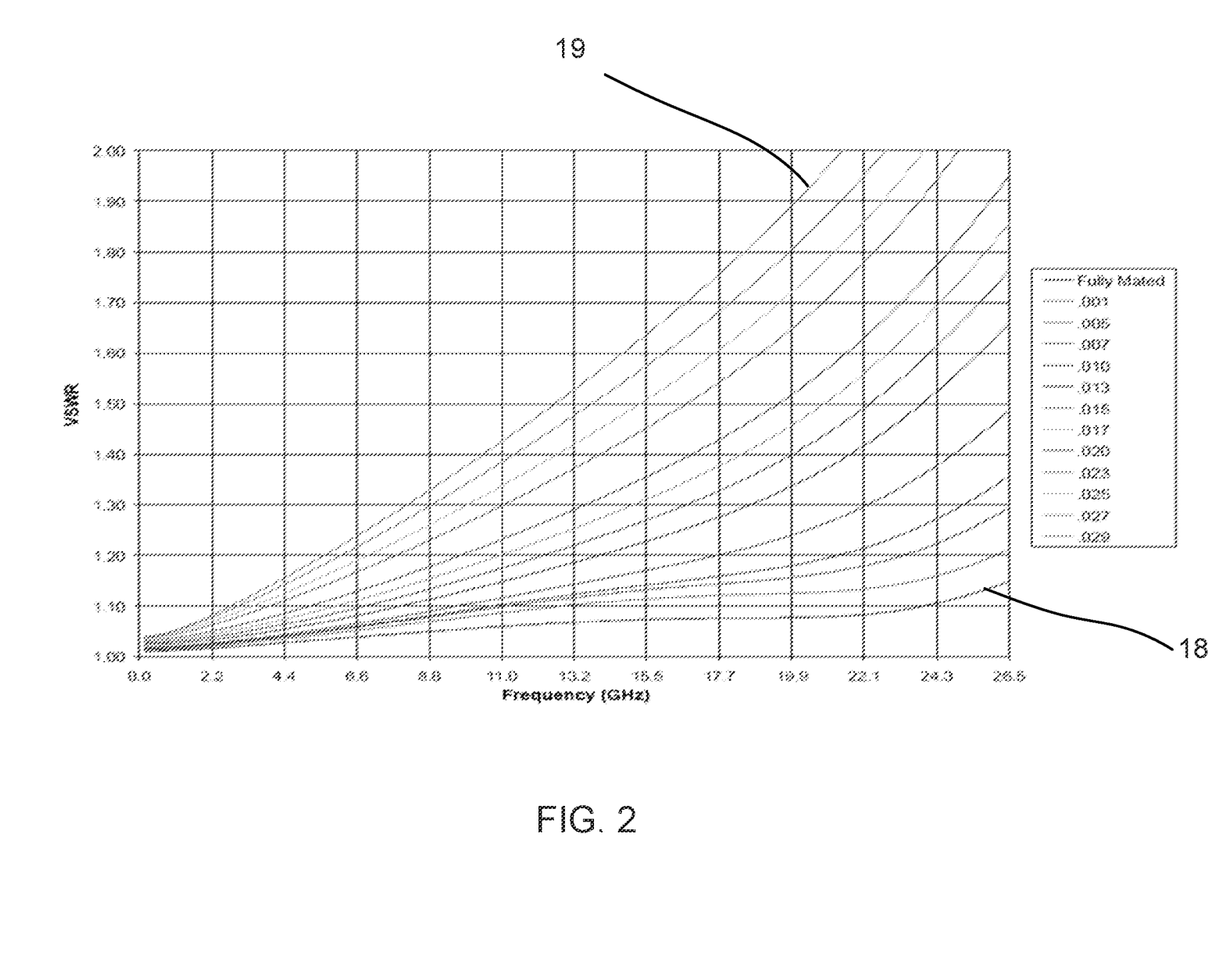
FIG. 2 illustrates an example VSWR chart showing the effect on VSWR of various axial gap distances between the bottom of a socket of a RF connector and an end of a RF bullet at different frequencies.

FIG. 2 illustrates the effect of an axial gap between the bottom of a socket of a RF connection, such as RF connector 14, and an end of a RF bullet, such as RF bullet 13, on the voltage standing wave ratio (VSWR) of a RF circuit connection assembly, such as RF circuit connection assemblies 11 and 12. At lower frequencies, such as 2.2 GHz, the change in VSWR between a fully mated interconnection (as shown by line 18) and a gap of 0.029 inch (as shown by line 19) is minimal. However, at higher frequencies, such as 19.9 GHz, the VSWR is almost doubled at a gap of 0.029 inch compared to a fully mated connection. FIG. 2 illustrates the effect on VSWR of various axial gap distances between the bottom of a socket of a RF connector and an end of a RF bullet at different frequencies where the gap distance ranges from fully mated to a gap distance of 0.029 (see progressively increasing gap distances from fully mated line 18 to the gap of 0.029 at line 19).

An increase in the VSWR in a RF connection can have serious performance implications for the stacked RF circuit board assembly 10. Thus, it is desirable to minimize the VSWR for any interconnection of the stacked RF circuit board assembly 10 by minimizing or eliminating the axial gap of the interconnection between the socket of the RF connector 14 and the RF bullet 13. A typical printed circuit board (PCB) can have a manufacturing tolerance of +/−10% in the thickness of the PCB. Thus, for a PCB having a nominal thickness of 0.100 inches, the actual thickness can vary by as much as +/−0.01 inches. Because each RF connector 14 is mounted to the circuit board, the reference plane for each RF connector 14 can vary by +/−0.01 inches. Since the length of the RF bullet 13 is dependent on the distance between the two reference planes, the variability of the distance the RF bullet 13 spans can be +/−0.02 inches in this example. Thus, if the RF bullet 13 were sized based on the minimum distance between the bottoms of the sockets of the RF connectors 14, the RF bullet 13 would need to be 0.02 inches less than the nominal distance to account for the worst case scenario in which each RF circuit board 16 is 0.01 inches thicker than expected. However, if the RF bullet 13 is 0.02 inches shorter than nominal and both RF circuit boards 16 were actually 0.01 inches thinner than nominal, the gap between the RF bullet 13 and a socket of the RF connector 14 could be as high as 0.04 inches after assembly.

Two existing options for addressing this problem of axial misalignment between the RF bullet and the RF socket include specifying tight manufacturing tolerances for the RF circuit boards and/or the use of spring-loaded RF bullets. However, both of these approaches are less than ideal for a number of reasons. For example, the substrate of a RF circuit board can be difficult to manufacture to high tolerances and costs can rise substantially if tighter tolerances are specified. Spring loaded RF bullets are not an ideal solution because they can be relatively expensive compared to a standard RF bullet and they can also lead to reduced VSWR performances.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein.

Reference will now be made to the examples illustrated, and specific language will be used herein to describe the same. It will nevertheless be understood that no limitation of the scope of the invention is thereby intended.

DETAILED DESCRIPTION

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

An initial overview of the inventive concepts is provided below, and then specific examples are described in further detail later. This initial summary is intended to aid readers in understanding the examples more quickly but is not intended to identify key features or essential features of the examples, nor is it intended to limit the scope of the claimed subject matter.

In one example, disclosed is a RF circuit connection assembly comprising a RF circuit board and a RF connector. The RF circuit board has a first side and a second side opposite the first side. The RF circuit board has a RF circuit supported on the first side and an aperture extending through the RF circuit board from the first side to the second side. The RF connector comprises a barrel having a socket configured to receive a RF bullet, a flange having a mounting surface, and a RF connector pin extending laterally from the barrel. The barrel of the RF connector extends through the aperture of the RF circuit board such that the mounting surface of the flange is seated against the first side of the RF circuit board, and the RF connector pin is electrically coupled to the RF circuit on the first side of the RF circuit board.

In accordance with a more detailed aspect, the flange can extend axially from the first side of the RF circuit board.

In accordance with a more detailed aspect, the barrel can comprise an external thread and the RF circuit connection assembly can further comprise a nut having an internal thread configured to be threaded over the barrel to secure the RF connector to the RF circuit board.

In accordance with a more detailed aspect, the RF circuit connection assembly can further comprise a body of a support structure in support of the RF circuit board. The body can have a circuit board mounting surface configured to couple to the first side of the RF circuit board.

In accordance with a more detailed aspect, the body can have a RF tuning cavity formed in the circuit board mounting surface. The tuning cavity can be configured to receive, at least in part, the RF connector. In other words, the RF connector can extend at least partially into the tuning cavity.

In accordance with a more detailed aspect, a RF connection reference plane of the RF circuit can be independent of a thickness of the RF circuit board.

In accordance with a more detailed aspect, the RF circuit connection assembly can further comprise a fixed length RF bullet having a first end and a second end opposite the first end, and the first end can be received in the socket of the RF connector.

In accordance with a more detailed aspect, the RF circuit connection assembly can further comprise a second RF circuit board and a second RF connector. The second RF circuit board can have a first side and a second side opposite the first side. The second RF circuit board can be spaced apart from the RF circuit board and have a second RF circuit on the first side of the second RF circuit board and a second aperture extending through the second RF circuit board to the second side of the second RF circuit board. The second RF connector can comprise a second barrel having a second socket configured to receive the second end of the fixed length RF bullet, a second flange having a second mounting surface, and a second RF connector pin extending laterally from the second barrel. The second barrel can extend through the second aperture such that the mounting surface of the flange is seated against the first side of the second RF circuit board, and the second RF connector pin is electrically coupled to the second RF circuit on the first side of the second RF circuit board.

In accordance with a more detailed aspect, the RF circuit connection assembly can further comprise a second RF circuit board and a second RF connector. The second RF circuit board can have a first side configured to couple to a mounting surface and a second side opposite the first side. The second RF circuit board can be spaced apart from the RF circuit board and have a second RF circuit on the second side of the second RF circuit board. The second RF connector can comprise a second barrel having a second socket configured to receive the second end of the fixed length RF bullet and a second RF connector pin extending laterally from the second barrel. The second RF connector pin can be electrically coupled to the second RF circuit on the second side of the second RF circuit board.

In accordance with a more detailed aspect, the circuit board mounting surface and the mounting surface of the flange can be coplanar.

In accordance with a more detailed aspect, the body can enclose, at least in part, the RF circuit board and the RF connector.

Also disclosed is a (RF) connector for coupling a RF bullet to a RF circuit board. The RF connector comprises a barrel, a flange, and a RF connector pin. The barrel comprises a first end having a socket configured to receive a RF bullet and a second end opposing the first end. The flange extends from the second end of the barrel and has a mounting surface facing the first end of the barrel. The RF connector pin extends laterally from the barrel and is positioned such that a connecting surface of the RF connector pin is flush with the mounting surface of the flange.

In accordance with a more detailed aspect, the barrel can further comprise an external thread and the RF connector can further comprise a nut having an internal thread complementary to the external thread of the barrel.

In accordance with a more detailed aspect, the flange and the nut can be configured to compress a RF circuit board between the mounting surface and the nut.

In accordance with a more detailed aspect, the barrel can have a window and the flange can have a corresponding gap. The RF connector pin can be located in the window and the corresponding gap.

Also disclosed is a method of manufacturing a RF connector. The method comprises forming a barrel comprising a first end having a socket configured to receive a RF bullet and a second end opposing the first end, forming a flange extending laterally from the second end of the barrel, the flange having a mounting surface facing the first end of the barrel, and forming a RF connector pin having a first end configured to couple to a RF bullet upon being received in the socket and a second end extending laterally from the barrel, the RF connector pin being positioned such that a connecting surface of the RF connector pin is flush with the mounting surface of the flange.

In accordance with a more detailed aspect, the method can further comprise forming an external thread on the barrel.

In accordance with a more detailed aspect, the method can further comprise threading a nut over the external thread of the barrel.

In accordance with a more detailed aspect, the method can further comprise forming a window in the second end of the barrel and a corresponding gap in the flange, wherein the second end of the RF connector pin is located in the window and the corresponding gap.

In accordance with a more detailed aspect, the method can further comprise forming the socket to have an internal profile that complements an external profile of a RF bullet.

Figure 3:
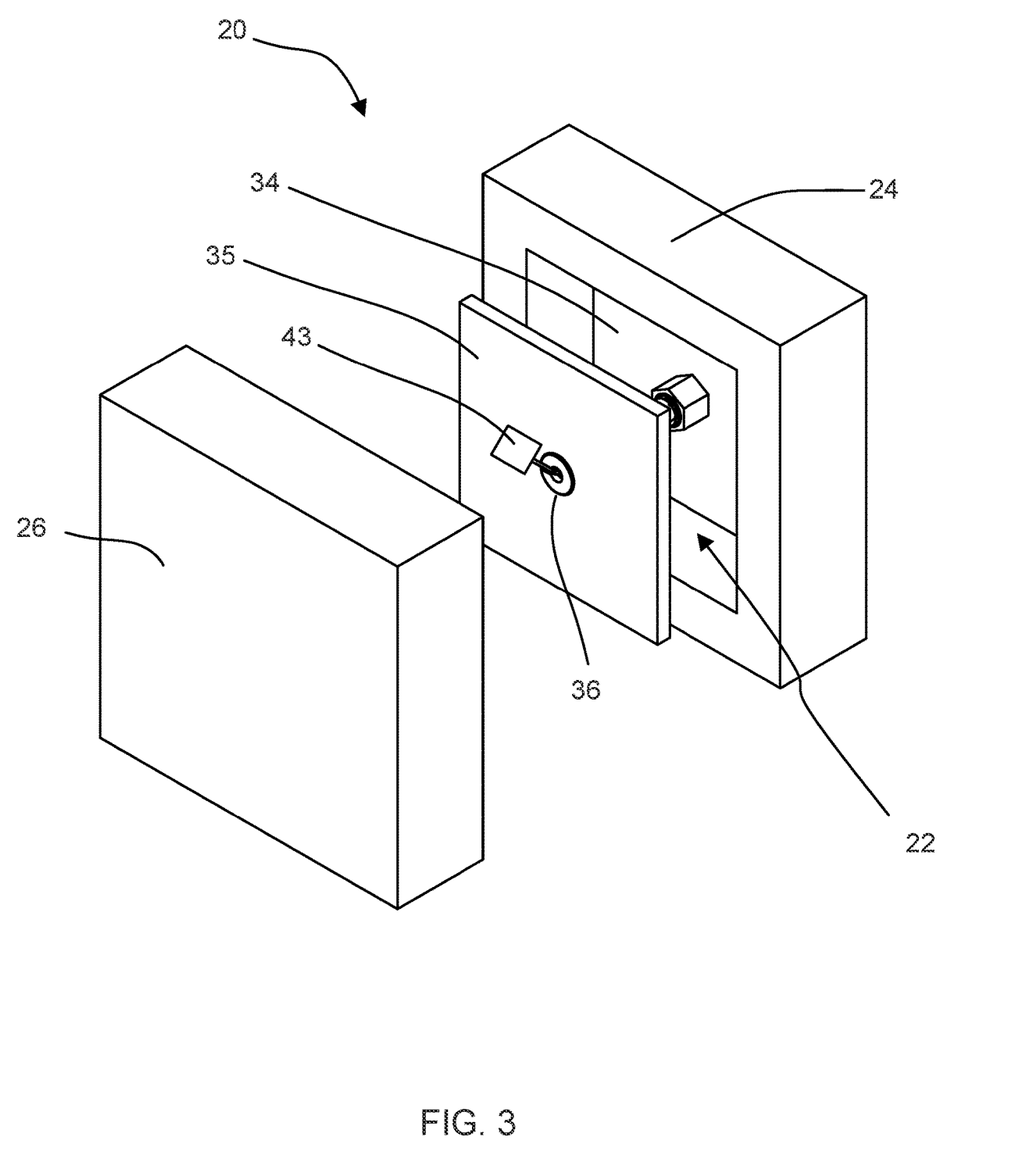
FIG. 3 illustrates a perspective view of a stacked RF circuit board illustrating two RF circuits interconnected by a RF bullet in accordance with an example of the present disclosure.
Figure 4:
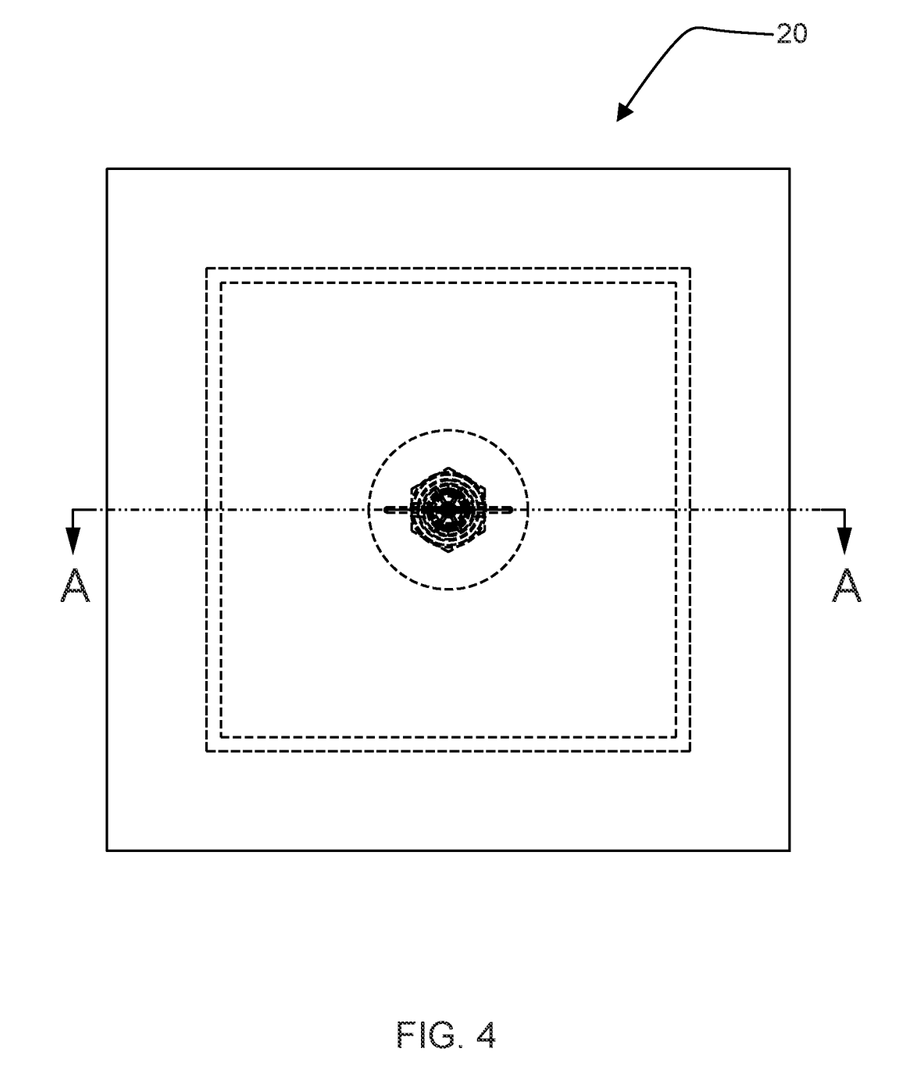
FIG. 4 illustrates a top view of the stacked RF circuit board of FIG. 3.
Figure 5:
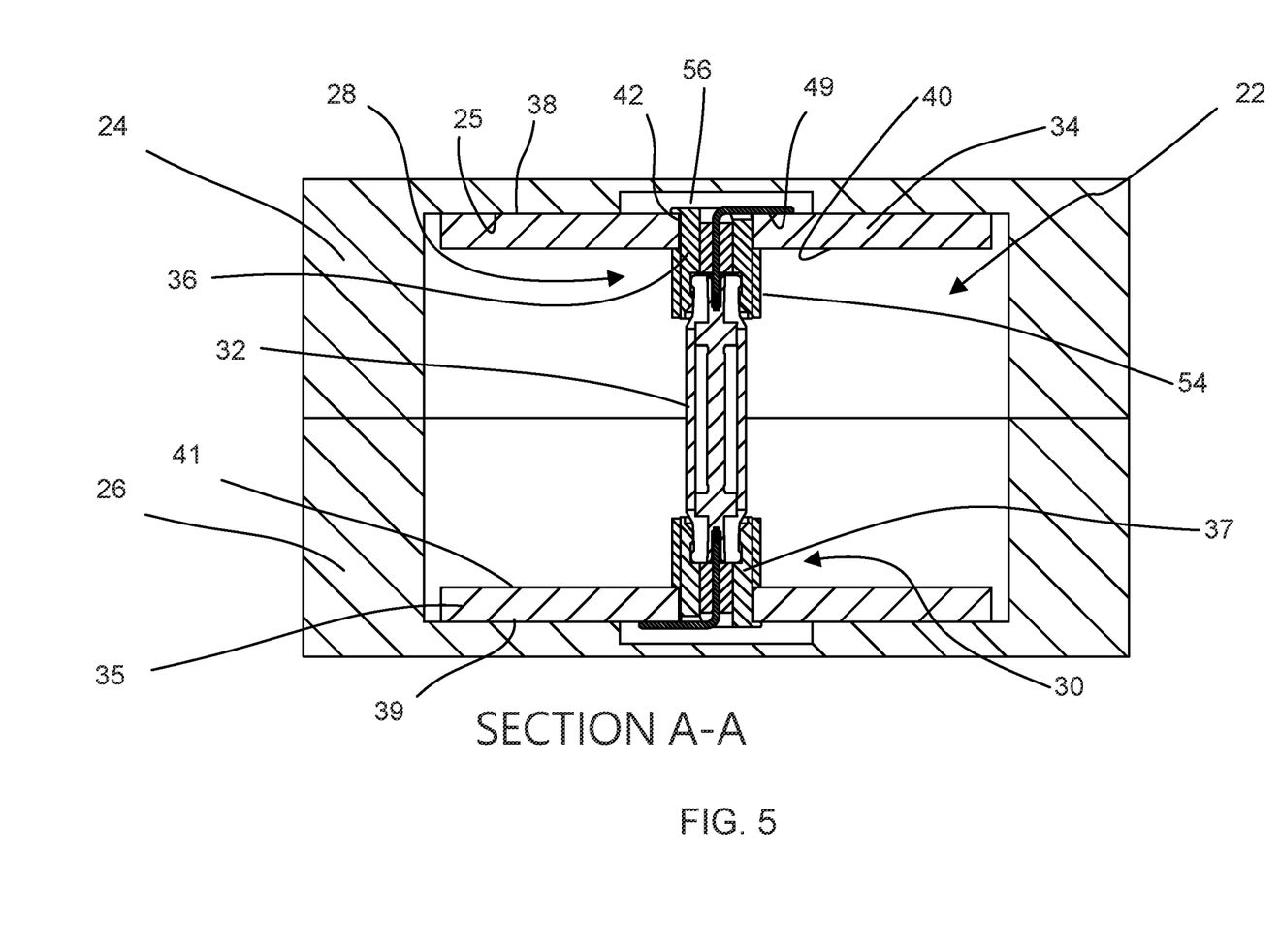
FIG. 5 illustrates a cross section of the stacked RF circuit board of FIGS. 3 and 4 taken about line AA of FIG. 4.
Figures 6, 7:
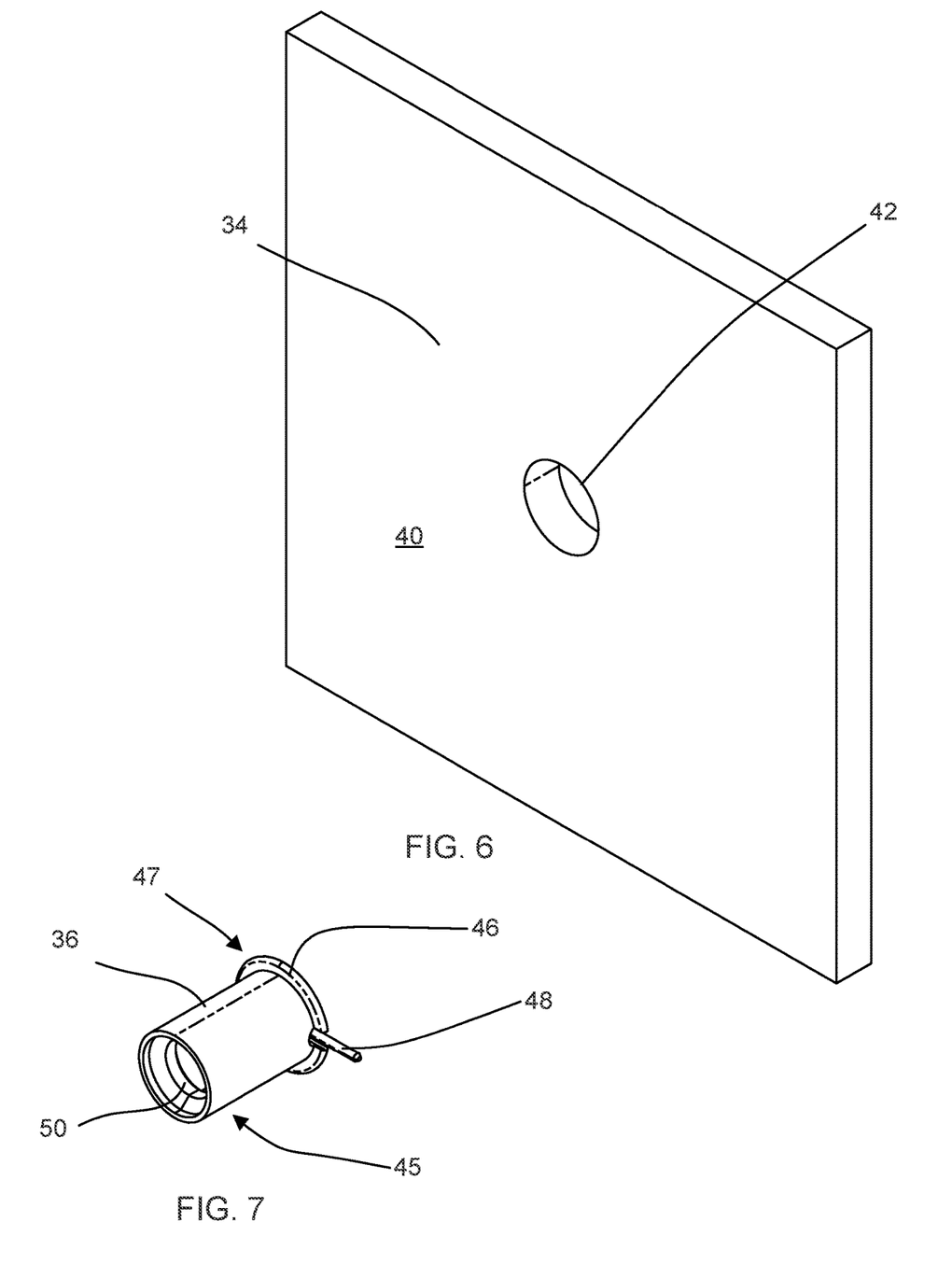
FIG. 6 illustrates a perspective view of an example RF circuit board.
FIG. 7 illustrates a perspective view of an example RF connector of the stacked RF circuit board of FIGS. 3-5.

To further describe the present technology, examples are now provided with reference to the figures. FIGS. 3-8 illustrate an example stacked RF circuit board assembly 22 and its component parts. FIG. 3 illustrates a perspective view of a support structure 20 enclosing the stacked RF circuit board assembly 22. FIG. 4 illustrates a top view of the support structure 20 enclosing the stacked RF circuit board assembly 22, FIG. 5 illustrates a cross section of the support structure 20 and the stacked RF circuit board assembly 22 taken along line AA of FIG. 4. FIG. 6 illustrates a perspective view of the RF circuit board 34 and FIG. 7 illustrates a perspective view of the RF connector 36. With reference to FIGS. 3-8, the support structure 20 can be any suitable structure for supporting a stacked RF circuit board assembly 22. The example support structure 20 comprises a first body 24 supporting a first RF circuit board 34 and a second body 26 supporting a second RF circuit board 35 and that together enclose and define a cavity for housing the stacked RF circuit board assembly 22. The first and second bodies 24, 26 can shield the stacked RF circuit board assembly 22 from external RF signals and inhibit RF signals from escaping the stacked RF circuit board assembly 22. The shape and orientation of the support structure 20 can determine the distance between the RF circuit boards 34, 35 in the stacked RF circuit board assembly 22. In some examples, the support structure 20 can be one or more components of a radar system. In essence, it is contemplated that the support structure 20 can comprise any type of structure for any type of RF system.

As shown in FIG. 5, the stacked RF circuit board assembly 22 can comprise a first RF circuit connection assembly 28 associated with the first RF circuit board 34 and a second RF circuit connection assembly 30 associated with the second RF circuit board 35 that can be interconnected by a RF bullet 32. The RF bullet 32 can be a conventional RF bullet and can have a fixed length. Although FIGS. 3-8 illustrate a stacked RF circuit board assembly having a single RF bullet interconnecting the first and second RF circuit boards 34, 35, one of ordinary skill in the art will recognize that multiple RF bullets may be used to interconnect the first and second RF circuit boards 34, 35 using multiple respective RF connector assemblies operable with each of the first and second RF circuit boards 34, 35 in a similar manner as discussed herein. The first RF circuit connection assembly 28 and the second RF circuit connection assembly 30 can be similar in their configuration, manner of connection, and function, as shown in FIG. 5, or in some examples, such as the example of FIG. 9, one of the first or second RF circuit connection assemblies 28, 30 can be a conventional RF circuit connection assembly with the other being in accordance with the technology shown and described in FIGS. 3-5. For example, in the RF circuit connection assembly of FIGS. 3-8 the second RF circuit board 35 is similar to the first RF circuit board 34 and has a first side 39 and a second side 41 opposite the first side 39 with an RF circuit on the first side 39. The second RF circuit board 35 is spaced apart from the first RF circuit board 34 and has a second aperture extending through the second RF circuit board 35 to the second side 41 of the second RF circuit board 35. A second RF connector 37 that may be similar to the RF connector of FIGS. 7 and 8 can have a barrel having a socket configured to receive the second end of the fixed length RF bullet 32, a flange having a mounting surface, and a RF connector pin extending laterally from the barrel. The barrel can extend through the second aperture such that the mounting surface of the flange is seated against the first side 39 of the second RF circuit board 35, and the RF connector pin is electrically coupled to the RF circuit on the first side of the second RF circuit board 35. Because the first and second RF circuit connection assemblies 28 and 30 of FIGS. 3-8 are similar, one of ordinary skill in the art will recognize that the following description is applicable to both the first and second RF circuit connection assemblies 28, 30 even though only the first RF circuit connection assembly 28 is described in detail.

The first RF circuit connection assembly 28 can comprise the first RF circuit board 34 and a RF connector 36. The first RF circuit board 34 can have an outer or first side 38 and an inner or second side 40 opposite the first side 38. The first side 38 of the RF circuit board 34 can comprise or be in support of a RF circuit 43. An aperture 42 extends from the first side 38 of the RF circuit board 34 to the second side 40 of the RF circuit board 34. The first side 38 of the RF circuit board 34 can be configured to mount to the support structure, such as first body 24. For example, the first body 24 can have a circuit board mounting surface 25 and the first side 38 of the RF circuit board 34 can mount to the circuit board mounting surface 25 using conventional techniques such as threaded fasteners, adhesives, or other techniques.

Figure 8:
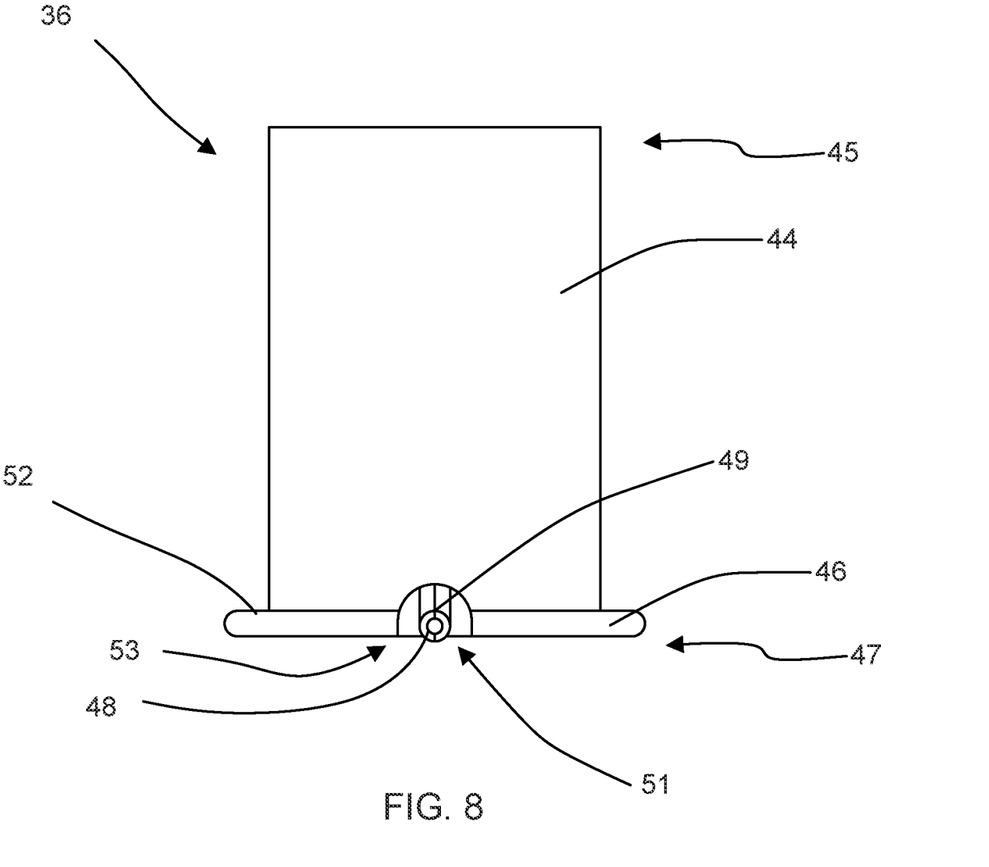
FIG. 8 illustrates a side view of the example RF connector of FIG. 7.

The RF connector 36 can comprise a barrel 44, a flange 46, and a RF connector pin 48 (see particularly FIGS. 7-8). The barrel 44 can comprise a first end 45 and a second end 47 opposite the first end 45. The first end 45 can have a socket 50 configured to receive a RF bullet (e.g., RF bullet 32). For example, the socket 50 can have an internal profile that complements, or matches, an external profile of an end of a RF bullet such that the socket 50 retains the RF bullet.

The flange 46 can extend outward or laterally from the second end 47 of the barrel 44 and can have a mounting surface 52 for interfacing with a RF circuit board (e.g., RF circuit board 34). The mounting surface 52 can be configured so as to face in the direction of the first end 45 of the barrel 44. Thus, the barrel 44 of the RF connector 36 can be inserted into the aperture 42 of the RF circuit board 34 such that the first end 45 of the barrel 44 extends from the second side 40 of the RF circuit board 34 and the mounting surface 52 can seat against and be flush with the first side 38 of the RF circuit board 34.

In some examples, the barrel 44 can have external threading (not shown) and a nut 54 having complementary threading can be threaded over the barrel 44 to secure the RF connector 36 to the RF circuit board 34. For example, the mounting surface 52 of the flange 46 can contact the first side 38 of the RF circuit board 34 and the nut 54 can be tightened so as to contact the second side 40 of the RF circuit board 34, compressing the RF circuit board 34 between the mounting surface 52 and the nut 54 to secure the RF connector 36. In other examples, the flange 46 can be soldered or otherwise coupled or secured to the RF circuit board 34 in place of the nut 54.

The RF connector pin 48 can be configured to communicatively couple, engage, or otherwise interface with a center conductor of a RF bullet inserted into the socket 50 of the RF connector 36. The second end 47 of the RF connector 36 can have a window 51 and the flange 46 can have a corresponding gap 53. The window 51 and the corresponding gap 53 allow the RF connector pin 48 to exit from the socket 50 of the barrel 44 without contacting the outer surface(s) of the RF connector 36. The RF connector pin 48 can extend laterally from the second end 47 of the barrel 44 through the window 51 and the corresponding gap 53 such that a portion of the RF connector pin 48 is located in the window 51 and the corresponding gap 53. The RF connector pin 48 can be configured to be flush with the mounting surface 52 of the flange 46. Thus, when the RF connector 36 is mounted in the aperture 42 of the RF circuit board 34, a connecting surface 49 of the RF connector pin 48 can be flush with the RF circuit on the first side 38 of the RF circuit board 34. The RF connector pin 48 can be electrically connected to the RF circuit 43 using conventional means such as soldering.

The first body 24 of the support structure 20 can have a tuning cavity 56 (see particularly FIGS. 3 and 5) formed in its circuit board mounting surface 25 that is positioned about the RF connector 36 and that at least partially receives and encloses the second end 47 of the RF connector 36. The tuning cavity 56 can also be configured to provide the necessary clearance for one or more RF circuits disposed on the first side 38 of the first RF circuit board 34, such that the RF circuit(s) are not interfered with (e.g., contacted) by the first body 24 of the support structure 20. It is noted that the second body 26 can also have a tuning cavity, which again, is not described in detail as it is similar in configuration and function as the tuning cavity 56. The tuning cavity 56 can comprise a sufficient size (e.g., space or volume) and configuration so as to provide a physical offset to prevent the second end 47 of the barrel 44 and the flange 46 from contacting the first body 24. Additionally, the tuning cavity 56 can be sized to attenuate RF energy that may leak from the RF connector 36. For example, the tuning cavity 56 can be sized relative to the expected operating wavelength of the stacked RF circuit board assembly 22 to cause attenuation of RF waves emitted from the RF connector 36. In some examples, the tuning cavity 56 can be sized so as to not propagate stray RF energy.

Advantageously, the RF connector 36 can be mounted to the first side 38 of the first RF circuit board 34 so as to cause the mounting surface 52 of the RF connector 36 and the connecting surface 49 of the RF connector pin 48 to be coplanar with the first side 38 of the RF circuit board 34 and the circuit board mounting surface 25 of the first support body 24. Thus, the reference plane is dependent on the first side 38 of the RF circuit board 34 which is mounted to the support structure 20 and independent of the second side 40 of the RF circuit board 34. Because the support structure 20 can typically be manufactured to a tighter tolerance than the RF circuit board 34 there is less variability in the position of the reference plane as compared to the prior example stacked RF circuit board assembly of FIG. 1. Furthermore, the RF connection reference plane is independent of the thickness of the RF circuit board 34 since the RF connection reference plane is on the same side as the mounting surface of the RF circuit board 34. Indeed, any change in the thickness of the RF circuit board 34 does not affect the position of the RF connector 36 relative to the support structure 20.

Since the RF connection plane is no longer dependent on the thickness of the circuit board, the RF bullet can be sized closer to the nominal distance between the bottoms of the RF sockets. Instead of sizing the bullet based on the variability in thickness of the RF circuit board, the bullet can be sized based on the variability of the mounting surface 52 of the support structure. Thus, the axial gap between the RF bullet 32 and each RF connector 36 can be reduced compared to a RF connector having an RF reference plane that varies based on the thickness of the RF circuit board 34. As shown in FIG. 2, a reduction in the axial gap results in an improved VSWR across a range of frequencies.

Figure 9:
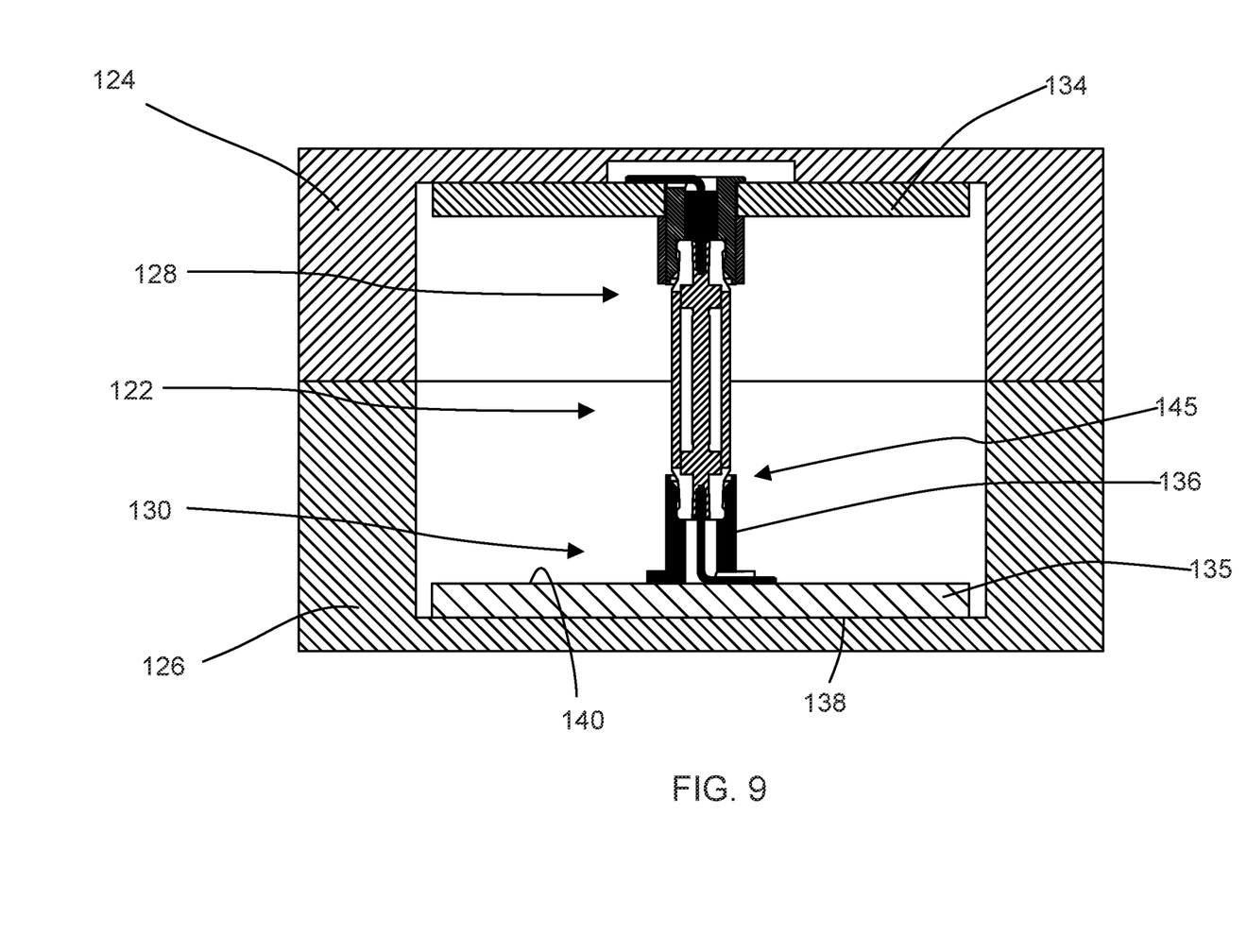
FIG. 9 illustrates a cross sectional view of an example stacked RF circuit board assembly.

FIG. 9 illustrates a cross-section of an example stacked RF circuit board assembly 122 enclosed by a first body 124 and a second body 126. The example stacked RF circuit board assembly 122 comprises a first RF circuit connection assembly 128 in accordance with the example RF circuit connection assembly of FIGS. 3-8 and a second RF circuit connection assembly 130 of a different type, such as a conventional RF circuit connection assembly (e.g., the example RF circuit connection assembly of FIG. 1). In other words, FIG. 9 illustrates how a stacked RF circuit board assembly 122 can comprise different types of connection assemblies operable with a RF bullet, where a first end of the RF bullet interfaces with a first RF circuit connection assembly in accordance with the technology described in FIGS. 3-8, and where the second end of the RF bullet interfaces with a different type of RF circuit connection assembly, such as a more conventional connection assembly. For example, the first body 124 with its associated RF circuit board 134 could be an updated component being retrofitted to an existing component represented by the second body 126 with its associated RF circuit board 135. In this example, the first RF circuit connection assembly 128 can be the same as the first RF circuit connection assembly 28 of FIGS. 3-8. The second RF circuit connection assembly 130 can be a conventional RF circuit connection assembly already in existence as associated with the second body 126 and the RF circuit board 135.

In contrast to the first RF circuit connection assembly 128, the second RF circuit connection assembly 130 comprises the second RF circuit board 135, which does not include an aperture for a RF connector 136. Furthermore, the second RF circuit board 135 has a first side 138 that mounts to the second body 126 and a second side 140 opposing the first side 138, wherein the second side 140 contains or supports a RF circuit. Thus, the RF circuit faces inward towards the RF bullet and a first end 145 of a barrel of the RF connector 136, whereas in the example of FIGS. 3-8 the RF circuit is mounted to the outer or first side of the RF circuit board, and faces away from the RF bullet and the first end of the barrel of the RF connector. The configuration shown in FIG. 9 results in a first reference plane associated with the first RF circuit connection assembly 128 that is located on the outer or first surface of the RF circuit board 134 and that is independent of the thickness of a first RF circuit board 134, and a second reference plane associated with the second RF circuit connection assembly 130 that is located on the inner or second side 140 of the second RF circuit board 135 and that is dependent on the thickness of the second RF circuit board 135.

It is to be understood that the examples set forth herein are not limited to the particular structures, process steps, or materials disclosed, but are extended to equivalents thereof as would be recognized by those ordinarily skilled in the relevant arts. It should also be understood that terminology employed herein is used for the purpose of describing particular examples only and is not intended to be limiting.

Furthermore, the described features, structures, or characteristics may be combined in any suitable manner in one or more examples. In the description, numerous specific details are provided, such as examples of lengths, widths, shapes, etc., to provide a thorough understanding of the technology being described. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the foregoing examples are illustrative of the principles of the invention in one or more particular applications, it will be apparent to those of ordinary skill in the art that numerous modifications in form, usage and details of implementation can be made without the exercise of inventive faculty, and without departing from the principles and concepts described herein.

Accordingly, it is not intended that the invention be limited, except as by the claims set forth below.

What is claimed is:

1. A radio frequency (RF) circuit connection assembly, comprising:
   a RF circuit board having a first side and a second side opposite the first side, the RF circuit board having a RF circuit supported on the first side and an aperture extending through the RF circuit from the first side to the second side; and
   a RF connector comprising a barrel having a socket configured to receive a RF bullet, a flange having a mounting surface, and a RF connector pin extending from the barrel, the barrel of the RF connector extending through the aperture of the RF circuit board such that the mounting surface of the flange is seated against the first side of the RF circuit board, and the RF connector pin is electrically coupled to the RF circuit on the first side of the RF circuit board.

2. The RF circuit connection assembly of claim 1, wherein the flange extends axially from the first side of the RF circuit board.

3. The RF circuit connection assembly of claim 1, wherein the barrel comprises an external thread, the RF circuit connection assembly further comprising a nut having an internal thread configured to be threaded over the barrel to secure RF connector to the RF circuit board.

4. The RF circuit connection assembly of claim 1, further comprising a body of a support structure in support of the RF circuit board, the body having a circuit board mounting surface configured to couple to the first side of the RF circuit board.

5. The RF circuit connection assembly of claim 4, wherein the body has a RF tuning cavity formed in the circuit board mounting surface configured to receive, at least in part, a first end of the RF connector, the flange being located at the first end.

6. The RF circuit connection assembly of claim 1, wherein a RF connection reference plane of the RF circuit is independent of a thickness of the RF circuit board.

7. The RF circuit connection assembly of claim 1, further comprising a fixed length RF bullet having a first end and a second end opposite the first end, wherein the first end is received in the socket of the RF connector.

8. The RF circuit connection assembly of claim 7, further comprising:
   a second RF circuit board having a first side and a second side opposite the first side, the second RF circuit board spaced apart from the RF circuit board and positioned such that the second side of the second RF circuit board faces towards the second side of the RF circuit board, the second RF circuit board having a RF circuit on the first side of the second RF circuit board and a second aperture extending through the second RF circuit board to the second side of the second RF circuit board; and
   a second RF connector comprising a barrel having a socket configured to receive the second end of the fixed length RF bullet, a flange having a mounting surface, and a RF connector pin extending from the barrel, the barrel extending through the second aperture such that the mounting surface of the flange of the second RF connector is seated against the first side of the second RF circuit board, and the RF connector pin of the second RF connector is electrically coupled to the RF circuit on the first side of the second RF circuit board.

9. The RF circuit connection assembly of claim 7, further comprising:
   a second RF circuit board having a first side configured to couple to a mounting surface and a second side opposite the first side, the second RF circuit board spaced apart from the RF circuit board and positioned such that the second side of the second RF circuit board faces towards the second side of the RF circuit board, the second RF circuit board having a RF circuit on the second side of the second RF circuit board; and
   a second RF connector comprising a barrel having a socket configured to receive the second end of the fixed length RF bullet and a RF connector pin extending laterally from the barrel, the RF connector pin electrically coupled to the RF circuit on the second side of the second RF circuit board.

10. The RF circuit connection assembly of claim 4, wherein the circuit board mounting surface and the mounting surface of the flange are coplanar.

11. The RF circuit connection assembly of claim 4, wherein the body encloses, at least in part, the RF connector.

12. A radio frequency (RF) connector for coupling a RF bullet to a RF circuit board, comprising:
   a barrel comprising a first end having a socket configured to receive a RF bullet and a second end opposing the first end;
   a flange extending from the second end of the barrel, the flange having a mounting surface facing the first end of the barrel; and
   a RF connector pin extending from the barrel, the RF connector pin having a connecting surface facing the first end of the barrel.

13. The RF connector of claim 12, wherein the barrel further comprises an external thread, the RF connector further comprising a nut having an internal thread complementary to the external thread of the barrel.

14. The RF connector of claim 13, wherein the flange and the nut are configured to compress a RF circuit board between the mounting surface and the nut.

15. The RF connector of claim 12, wherein the barrel has a window and the flange a corresponding gap, and wherein the RF connector pin is located in the window and the corresponding gap.

16. A method of manufacturing a RF connector, the method comprising:

forming a barrel comprising a first end having a socket configured to receive a RF bullet and a second end opposing the first end;

forming a flange extending from the second end of the barrel, the flange having a mounting surface facing the first end of the barrel; and forming a RF connector pin having a first end configured to couple to a RF bullet upon being received in the socket and a second end extending from the barrel, the RF connector pin being positioned such that a connecting surface of the RF connector pin faces the first end of the barrel.

17. The method of claim 16 further comprising forming an external thread on the barrel.

18. The method of claim 17, further comprising threading a nut over the external thread of the barrel.

19. The method of claim 16, further comprising forming a window in the second end of the barrel and a corresponding gap in the flange, wherein the second end of the RF connector pin is located in the window and the corresponding gap.

20. The method of claim 16, further comprising forming the socket to have an internal profile that complements an external profile of a RF bullet.

21. A radio frequency (RF) circuit connection assembly, comprising:

a support structure comprising a body having a circuit board mounting surface;

a RF circuit board having a first side coupled to the circuit board mounting surface of the support structure, and a second side opposite the first side; and a RF circuit supported on the first side of the RF circuit board, wherein the RF circuit is disposed between the RF circuit board and the body of the support structure.

22. The RF circuit connection assembly of claim 21, further comprising a RF connector comprising a barrel having a socket configured to receive a RF bullet, a flange having a mounting surface, and a RF connector pin extending from the barrel, the barrel of the RF connector extending through an aperture extending through the RF circuit from the first side to the second side of the RF circuit board, such that the mounting surface of the flange is seated against the first side of the RF circuit board, and the RF connector pin is electrically coupled to the RF circuit on the first side of the RF circuit board.

23. The circuit connection assembly of claim 22, wherein the body of the support structure has a RF tuning cavity formed in the circuit board mounting surface configured to receive, at least in part, a first end of the RF connector, the flange of the RF connector being located at the first end.

* * * * *